United States Patent
Mueller et al.

(10) Patent No.: US 9,632,123 B2
(45) Date of Patent: Apr. 25, 2017

(54) MICROMECHANICAL ELECTRIC FIELD METER AS A THUNDERSTORM WARNING DEVICE

(71) Applicant: Robert Bosch GmbH, Stuttgart (DE)

(72) Inventors: Lutz Mueller, Aichtal (DE); Jochen Beintner, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 359 days.

(21) Appl. No.: 14/100,844

(22) Filed: Dec. 9, 2013

(65) Prior Publication Data
US 2014/0167732 A1    Jun. 19, 2014

(30) Foreign Application Priority Data
Dec. 12, 2012   (DE) .................. 10 2012 222 973

(51) Int. Cl.
*G01R 29/12* (2006.01)
*G01W 1/16* (2006.01)

(52) U.S. Cl.
CPC .............. *G01R 29/12* (2013.01); *G01W 1/16* (2013.01)

(58) Field of Classification Search
None
See application file for complete search history.

(56) References Cited

U.S. PATENT DOCUMENTS

| | | | | |
|---|---|---|---|---|
| 6,215,318 B1 * | 4/2001 | Schoefthaler | ...... | G01R 33/0035 324/658 |
| 6,282,960 B1 * | 9/2001 | Samuels | ............... | B81B 3/0078 73/514.32 |
| 7,212,007 B2 * | 5/2007 | Yasuda | ................ | G01R 29/12 324/458 |
| 2006/0082251 A1 * | 4/2006 | He | ........................ | H02N 1/006 310/309 |

(Continued)

FOREIGN PATENT DOCUMENTS

DE    102008052477 A1 *   6/2010   ............. G01R 29/12

OTHER PUBLICATIONS

Burger et al DE 102008052477 "Electrical field strength measuring sensor for use as microelectromechanical system sensor, has electrode arrangement including electrode strips located in spaces between electrode strips of another electrode arrangement" (English Machine Translation, Published Jun. 10, 2010).*

*Primary Examiner* — Melissa Koval
*Assistant Examiner* — Felicia Farrow
(74) *Attorney, Agent, or Firm* — Gerard Messina

(57) ABSTRACT

A micromechanical structure, in particular a micromechanical electric field meter as a thunderstorm warning device, for detection of an electric field, comprising a substrate having a principal extension plane, a first electrode, a second electrode, and a drive assemblage for producing a relative motion of the second electrode with respect to the first electrode into an overlapping position, the first electrode and the second electrode being, in the overlapping position, (Continued)

disposed above one another in a projection direction extending perpendicularly to the principal extension plane of the substrate, wherein the second electrode has a defined potential for shielding the first electrode with respect to the electric field in the overlapping position.

17 Claims, 7 Drawing Sheets

(56) References Cited

U.S. PATENT DOCUMENTS

| | | | |
|---|---|---|---|
| 2008/0129302 A1* | 6/2008 | Shafai | G01R 29/12 324/458 |
| 2011/0030475 A1* | 2/2011 | Stahl | G01P 15/125 73/514.32 |
| 2011/0056295 A1* | 3/2011 | Classen | B81B 7/02 73/514.32 |
| 2012/0234093 A1* | 9/2012 | Black | H01L 41/08 73/504.08 |

* cited by examiner

MICROMECHANICAL ELECTRIC FIELD METER AS A THUNDERSTORM WARNING DEVICE

RELATED APPLICATION INFORMATION

The present application claims priority to and the benefit of German patent application no. 10 2012 222 973.6, which was filed in Germany on Dec. 12, 2012, the disclosure of which is incorporated herein by reference.

FIELD OF THE INVENTION

The present invention proceeds from an electric field meter as a thunderstorm warning device.

BACKGROUND INFORMATION

Electric field meters of this kind are believed to be used as thunderstorm warning devices. The document DE 1 591 932, for example, discusses a diaphragm-less field mill for measuring electrostatic fields and voltages; in the field mills according to the existing art, a vane wheel driven by a motor and connected via wiper contacts to ground is disposed between a perforated shield functioning as a diaphragm, and a high-resistance collector electrode held in the form of a circular disk in the insulating ring, in such a way that a periodically fluctuating portion of an external electrostatic force field arrives at the collector electrodes and influences an alternating electrical charge there.

Measuring instruments for measuring the electric field, in particular electric field meters (also referred to as e-field meters), whose manner of operation is based on the known principle of the field mill, are already known in the existing art. Measuring instruments of this kind are relatively large in comparison with micromechanical structures, for example several centimeters in at least one spatial dimension. In addition, large electric field meters of this kind are dependent on a relatively strong energy source. These electric field meters are used, for example, as thunderstorm warning devices, being configured to measure the static electric field of the near-surface atmosphere. Provision is made here that when the electric field strength exceeds a specific limit value, for example 1 kV/m, a thunderstorm warning display is activated even before the first lightning bolt. Electric field meters configured as thunderstorm warning devices make use of the knowledge that a rise in the electric field strength of the near-surface atmosphere to values greater than 1 kV/m, or a change in the polarity of the electric field, indicates an approaching thunderstorm front. Such electric field meters are used, for example, for thunderstorm warning at high-altitude observatories, the voltage values being recorded.

Also known are thunderstorm warning devices configured as lightning detectors, which measure the pulsed alternating electric field of the electromagnetic lightning pulses caused by lightning, which are also referred to as LEMP or "sferics." Lightning detectors have a receiver for alternating electromagnetic fields, and are provided for the detection of pulses at various frequencies. Lightning detectors detect the lightning bolts of approaching thunderstorms, for example, over comparatively long distances.

Thunderstorms can be life-threatening, especially for a person who is outdoors. In good weather the electric field strength is in the range from approx. 100 V/m to 300 V/m. Below a thunderstorm the electric field strength has values of up to −30,000 V/m or +30,000 V/m. These changes in the electric field occur earlier in time than a thunderstorm, and can be used to predict the thunderstorm. Changes in the field strength of the atmosphere's electric field can be used as thunderstorm indicators and/or lightning indicators. The thunderstorm warning devices according to the existing art are, however, cumbersome, large, and dependent on an energy source that the user must also carry. An object of the present invention is therefore to make available a thunderstorm warning device, for incorporation into small portable devices for use outdoors or in vehicles, that does not exhibit the disadvantages of the existing art and that is particularly light and portable in use. This makes possible field strength measurement, for example during a thunderstorm, that is particularly simple and energy-saving, in particular cost-saving, compared with the existing art.

SUMMARY OF THE INVENTION

The micromechanical structure according to the present invention, in particular the micromechanical electric field meter use as a thunderstorm warning device, for detection of an electric field, in accordance with the main claim, has the advantage as compared with the existing art that a thunderstorm warning device is thereby provided as a miniaturized field strength measuring instrument. This thunderstorm warning device has in particular a miniaturized, very light and small micromechanical structure, referred to as a microelectromechanical sensor (MEMS), for detecting lightning risk by measuring the near-surface atmospheric electric field, and can be integrated, in particular incorporated, into a plurality of portable, in particular small objects and/or devices, for example wristwatches, mobile telephones, umbrellas, golf clubs, golf carts, or golf bags. The micromechanical structure according to the present invention thus implements a mobile thunderstorm warning device for sport participants, for example for sports such as climbing, hiking, boating, or golf, for motor vehicles and/or watercraft. In motor vehicles, the risk of tire perforation due to lightning conduction can, particularly advantageously, be considerably reduced by way of the thunderstorm warning device.

A further particularly advantageous application of the mobile device according to the present invention is warning of triboelectric discharges (referred to as ESD monitoring), which encompasses, for example, warning of high-voltage fields for sensitive persons. For example, a micromechanical structure according to the present invention, also referred to as a "sensor," can be configured for use in work clothing for rail workers, in helmets, and/or on an excavator shovel. A further advantageous application of the sensor according to the present invention consists in use of the sensor in connection with facilities, for example wind power installations and/or cableways, for example so that operation of the facilities can be halted in timely fashion before a thunderstorm on the basis of a thunderstorm warning produced by the sensor.

The micromechanical structure according to the present invention can furthermore be configured particularly advantageously for use in a cable locator, for example in order to determine the orientation and/or position of electrical lines. The micromechanical structure according to the present invention is provided or configurable particularly for integration into mobile telephones or smartphones, in particular in combination with a software program. It is moreover advantageously possible to use the micromechanical structure as a proximity switch. A micromechanical structure having a first electrode connected fixedly to the substrate produces the advantage that as a result of a deflection of the second electrode at an oscillation frequency predefined by the drive device, the second electrode has a defined potential, in particular a ground potential, for shielding the first electrode from the electric field in the overlapping position.

The second electrode may have the ground potential of an external ground that is a ground potential, in particular of a housing of an electrical device or of the Earth. The housing of the micromechanical structure has a material that is permeable to static electric fields, for example glass, low-doped silicon, or polymer, in particular a conductive polymer. The requirement regarding the material of the housing is in particular that electromagnetic fields from outside not be shielded. When the first electrode and the second electrode are not in the overlapping position, the electric field influences electric charges as a function of the field strength of the electric field and the polarity of the electric field in the first electrode. As a result of the, in particular periodic, relative motion of the shielding second electrode with respect to the first electrode, a first voltage signal exhibiting the oscillation frequency is generated in the first electrode as a function of the field strength and/or polarity of the electric field. "Relative motion" includes a motion both of the first electrode and of the second electrode relative to the substrate, as well as a motion only of one of the two electrodes, i.e. of either the first electrode or the second electrode, relative to the substrate, the respective other electrode being connected fixedly to the substrate.

The micromechanical structure may have an evaluation device having a charge amplifier in order to generate an evaluation signal, in particular a second voltage signal amplified with respect to the first voltage signal, as a function of the first voltage signal brought about by the field strength of the electric field and the relative motion of the second electrode. In particular, only the field strength of a component of the electric field in a direction extending perpendicularly to the principal extension plane of the substrate is evaluated. In particular, the evaluation device is configured for signal processing of the voltage signal to yield a digitized signal, for example by way of an analog/digital converter, or to yield a calibrated signal.

Advantageous embodiments and refinements of the invention may be gathered from the dependent claims and from the description with reference to the drawings.

According to a refinement, provision is made that the defined potential is a ground potential, in particular the potential of the Earth, and/or the micromechanical structure has a further first electrode connected fixedly to the substrate, the drive assemblage being configured to produce the relative motion of the second electrode and the first electrode relative to one another between the overlapping position and a further overlapping position, the further first electrode and the second electrode being, in the further overlapping position, disposed above one another in a projection direction. It is thereby advantageously possible to make available a fully differential evaluation of the first voltage signal brought about at the first electrode, and of a further first voltage signal brought about at the further first electrode, as a function of the field strength of the electric field. The evaluation device has, in particular, a fully differential charge amplifier, a first input of the evaluation device being conductively connected to the first electrode, a second input of the evaluation device being connected to the further first electrode, and the evaluation device generating a second voltage signal, the evaluation device having a fully differential evaluation circuit for generating a fully differential second voltage signal. It is thereby advantageously possible to achieve a higher signal-to-noise ratio, in particular better robustness, for the micromechanical structure.

According to a further refinement, provision is made that the first electrode and the further first electrode are disposed in a first electrode plane oriented parallel to the principal extension plane of the substrate, the first electrode and the further first electrode being disposed in the first electrode plane in a manner electrically insulated from one another and next to one another in a projection direction, the second electrode being disposed in a second electrode plane oriented parallel to the principal extension plane of the substrate. It is thereby advantageously possible to achieve a higher signal-to-noise ratio, in particular better robustness, for the micromechanical structure.

According to a further refinement, provision is made that the first electrode has a first sub-electrode, in particular the first electrode has a further first sub-electrode, and the second electrode has a second sub-electrode, the drive assemblage being configured to produce the relative motion of the second electrode between the overlapping position and an uncovered position, the first sub-electrode and the second sub-electrode being, in the uncovered position, disposed in particular at least in part next to one another in the projection direction, in particular the drive assemblage being configured to produce the relative motion of the second electrode between the overlapping position and the further overlapping position, in particular the further first sub-electrode and the second sub-electrode being, in the further overlapping position, disposed above one another in the projection direction.

It is thereby advantageously possible to achieve a higher signal-to-noise ratio, in particular better robustness, for the micromechanical structure.

According to a further refinement, provision is made that the first sub-electrode, in particular the further first sub-electrode, and the second sub-electrode have a principal extension direction parallel to the principal extension plane of the substrate, the drive assemblage being configured to produce the relative motion of the second electrode in a drive direction perpendicular to the principal extension direction.

It is thereby advantageously possible to achieve a higher signal-to-noise ratio, in particular better robustness, for the micromechanical structure.

According to a further refinement, provision is made that the first electrode has a plurality of first sub-electrodes conductively connected to one another, in particular the further first electrode has the plurality of further first sub-electrodes conductively connected to one another, and the second electrode has the plurality of second sub-electrodes conductively connected to one another, the plurality of first sub-electrodes and the plurality of second sub-electrodes all being, in the overlapping position, disposed above one another in a projection direction, in particular the plurality of first sub-electrodes and the plurality of second sub-electrodes all being, in a further overlapping position, disposed above one another in a projection direction. It is thereby advantageously possible to achieve a higher signal-to-noise ratio, in particular better robustness, for the micromechanical structure.

According to a further refinement, provision is made that the plurality of first sub-electrodes, in particular the plurality of further first sub-electrodes, and the plurality of second sub-electrodes are all oriented parallel to the principal extension direction, the plurality of first sub-electrodes all being disposed spaced apart from one another, in particular the plurality of further first sub-electrodes all being disposed spaced apart from one another, and the plurality of second sub-electrodes all being disposed spaced apart from one another, in particular the plurality of further first sub-electrodes being disposed engagingly between the plurality of first sub-electrodes. It is thereby advantageously possible to achieve a higher signal-to-noise ratio, in particular better robustness, for the micromechanical structure.

According to a further refinement, provision is made that the first electrode is disposed in a first circular plane located in the first electrode plane, and the second electrode is disposed in a second circular plane located in the second electrode plane, the first circular plane and the second circular plane being disposed parallel to the principal extension plane of the substrate and centeredly above one another in the projection direction, the drive assemblage being configured to produce the relative motion, in particular rotational motion, of the second electrode around a rotation axis extending centeredly through the first circular plane, centeredly through the second circular plane, and perpendicularly to the principal extension plane of the substrate. The micromechanical structure according to the present invention, in particular the micromechanical electric field meter as a thunderstorm warning device, for detection of an electric field has the advantage with respect to the existing art that the thunderstorm warning device is a miniaturized field strength measuring instrument.

According to a further refinement, provision is made that the first electrode has a first sub-electrode embodied as a first circle segment, in particular the further first electrode has a further first sub-electrode embodied as a further first circle segment, and the second electrode has a second sub-electrode embodied as a second circle segment, the first circle segment, in particular the further first circle segment, and the second circle segment being embodied congruently, in particular the first circle segment and the further first circle segment being disposed next to one another in a circumferential direction of the first circular plane, the first circle segment and the second circle segment being, in the overlapping position, disposed above one another in a projection direction, in particular the further first circle segment and the second circle segment being, in the further overlapping position, disposed above one another in a projection direction. It is thereby advantageously possible to achieve a higher signal-to-noise ratio, in particular better robustness, for the micromechanical structure.

According to a further refinement, provision is made that the first electrode has a plurality of first sub-electrodes embodied as first circle segments, in particular the further first electrode has the plurality of further first sub-electrodes embodied as further first circle segments, and the second electrode has the plurality of second sub-electrodes embodied as second circle segments, the first circle segments, in particular the further first circle segments, and the second circle segments all being embodied congruently, in particular each first circle segment being disposed between two further first circle segments in a circumferential direction in the first circular plane, the second circle segments all being, in the overlapping position, disposed above the plurality of first circle segments in a projection direction, in particular the second circle segments all being, in the further overlapping position, disposed above the plurality of further first circle segments in a projection direction. It is thereby advantageously possible to achieve a higher signal-to-noise ratio, in particular better robustness, for the micromechanical structure.

According to a further refinement, provision is made that the substrate of the micromechanical structure encompasses a material made of, in particular doped, silicon and/or conductive polymer, the micromechanical structure having in particular a housing made of silicon, polymer, and/or ceramic. For example, the housing is embodied as a molded housing having a cover that is transparent to electric fields.

According to a further refinement, an electrical device, in particular a portable and/or programmable electrical device, is provided, which device has a software program, the software program being configured for use in combination with the micromechanical structure. The micromechanical structure according to the present invention, in particular the micromechanical electric field meter as a thunderstorm warning device, for detection of an electric field has the advantage with respect to the existing art that the thunderstorm warning device is a miniaturized field strength measuring instrument.

According to a further refinement, a sensor assemblage having a plurality of micromechanical structures is provided, the principal extension planes of the substrates of the plurality of micromechanical structures being disposed parallel to one another and/or perpendicular to one another for positionally resolved measurement and/or time-resolved measurement of the electric field, or the sensor assemblage being configured with a positionally dependent structure for non-contact detection of a motion of an electrostatically charged object, in particular of a user's hand, and/or for detection of an electric field generated by a device. It is thereby possible, particularly advantageously, to perform a time-resolved and/or positionally resolved measurement of the electric field. It is furthermore conceivable to measure with this assemblage, in positionally resolved fashion, an electric field that is generated by a device and has a defined positional dependence. This particularly advantageously provides a capability for using the sensor assemblage in near field communication (also referred to as NFC), for example in order to read out electrostatically charged letters, in particular Braille.

Exemplifying embodiments of the present invention are depicted in the drawings and explained in further detail in the description that follows.

DETAILED DESCRIPTION

Figure 1A:
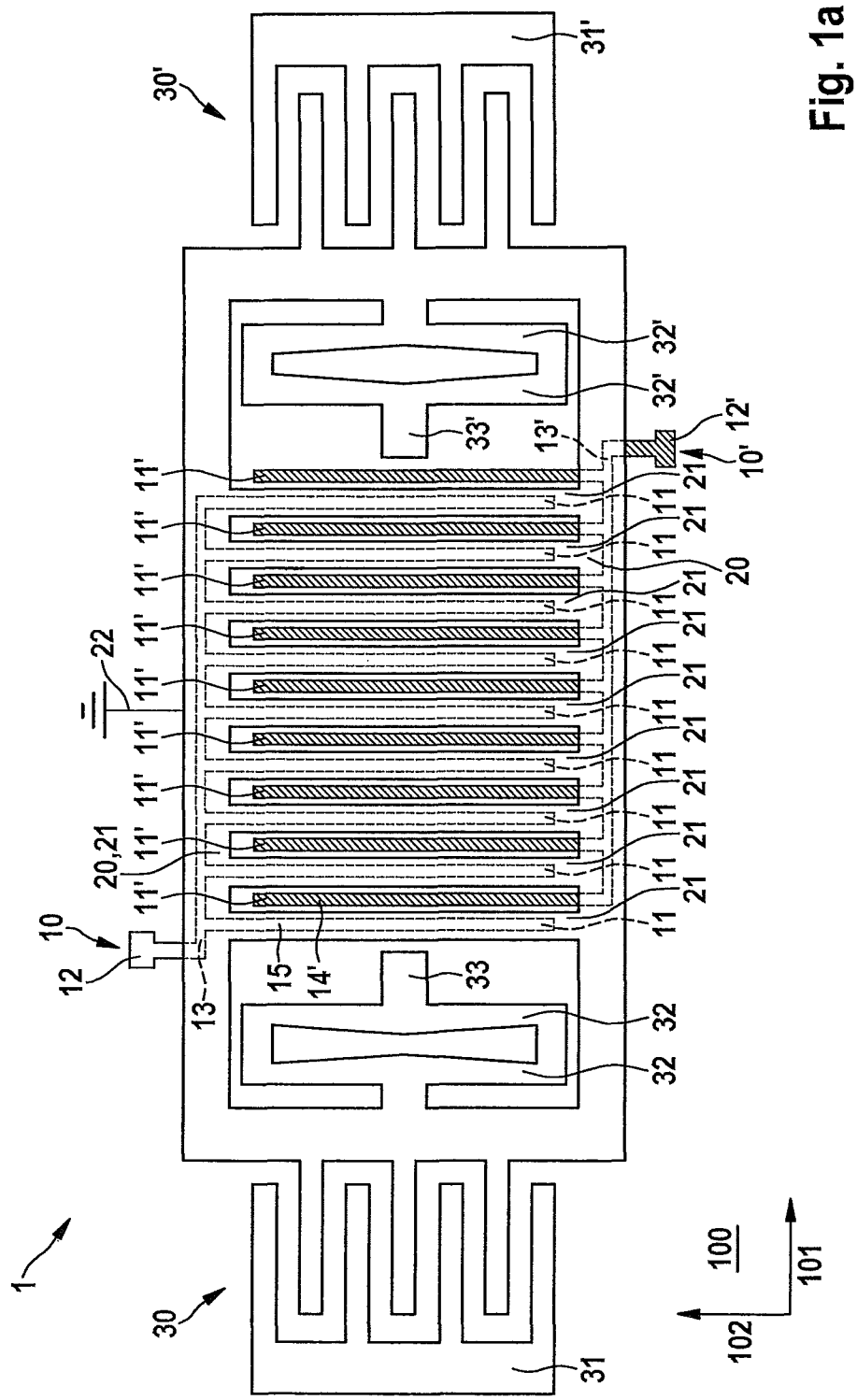
FIGS. 1a, 1b, and 1c show schematic plan views in accordance with a first embodiment of the present invention.

In the various Figures, identical parts are always labeled with identical reference characters and are therefore as a rule each recited or mentioned only once.

Figure 1B:
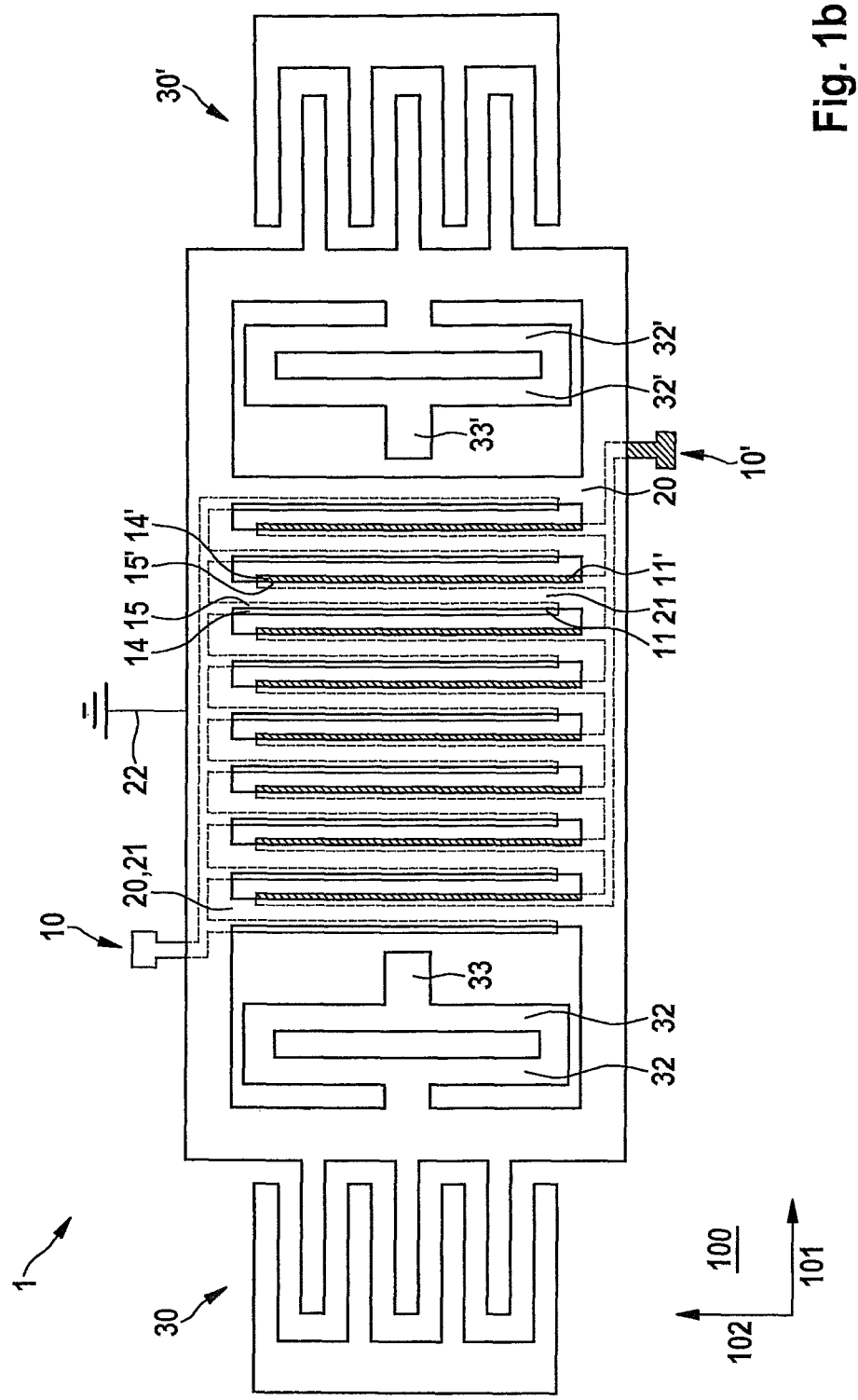
Figure 1C:
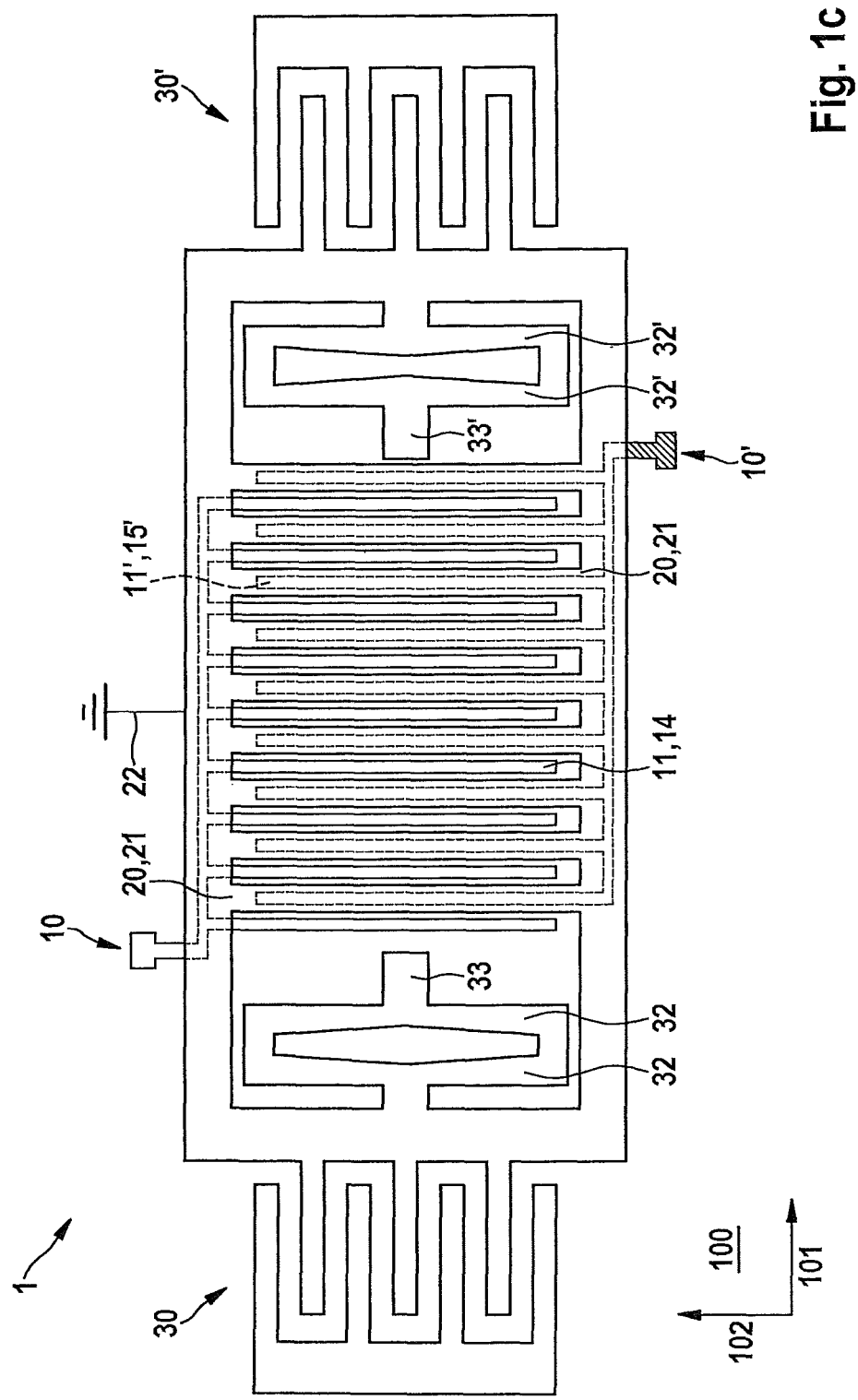

FIGS. 1a to 1c are schematic plan views depicting a first embodiment of the present invention. Micromechanical structure 1, also referred to as sensor 1 or as surface micromechanical (SMM) field mill 1, is configured to measure the electrical field strength and/or polarity, in particular a component, of an external electric field acting on micromechanical structure 1 in a projection direction 201 extending perpendicular to a main extension plane 100. Substrate 40 of SMM field mill 1 is manufactured, for example, from silicon 42 (e.g., shown in FIG. 2).

SMM field mill 1 has a first electrode plane 200' (e.g., shown in FIG. 2) having a first electrode 10 and a further first electrode 10', as well as a second electrode plane 200" (e.g., shown in FIG. 2) having a second electrode 20. First electrode 10 and further first electrode 10' of first electrode plane 200' are applied fixedly onto an insulating layer 41 (e.g., shown in FIG. 2) of substrate 40 (e.g., shown in FIG. 2), in particular onto an oxide layer 41. First electrode 10 of first electrode plane 200' may have a plurality of first sub-electrodes 11, and further first electrode 10' may have the plurality of further first sub-electrodes 11', first sub-electrodes 11 being respectively conductively connected to one another, and further first sub-electrodes 11' being respectively conductively connected to one another.

First electrode 10 furthermore encompasses a contact point 12 and a conductor path assemblage 13 for creating the conductive connection between first sub-electrodes 11, which is disposed in particular on an insulating layer 41 of substrate 40. The further first electrode likewise encompasses a further contact point 12' and a further conductor path 13' for creating the conductive connection between further first sub-electrodes 11' on insulating layer 41 of substrate 40.

Figure 2:
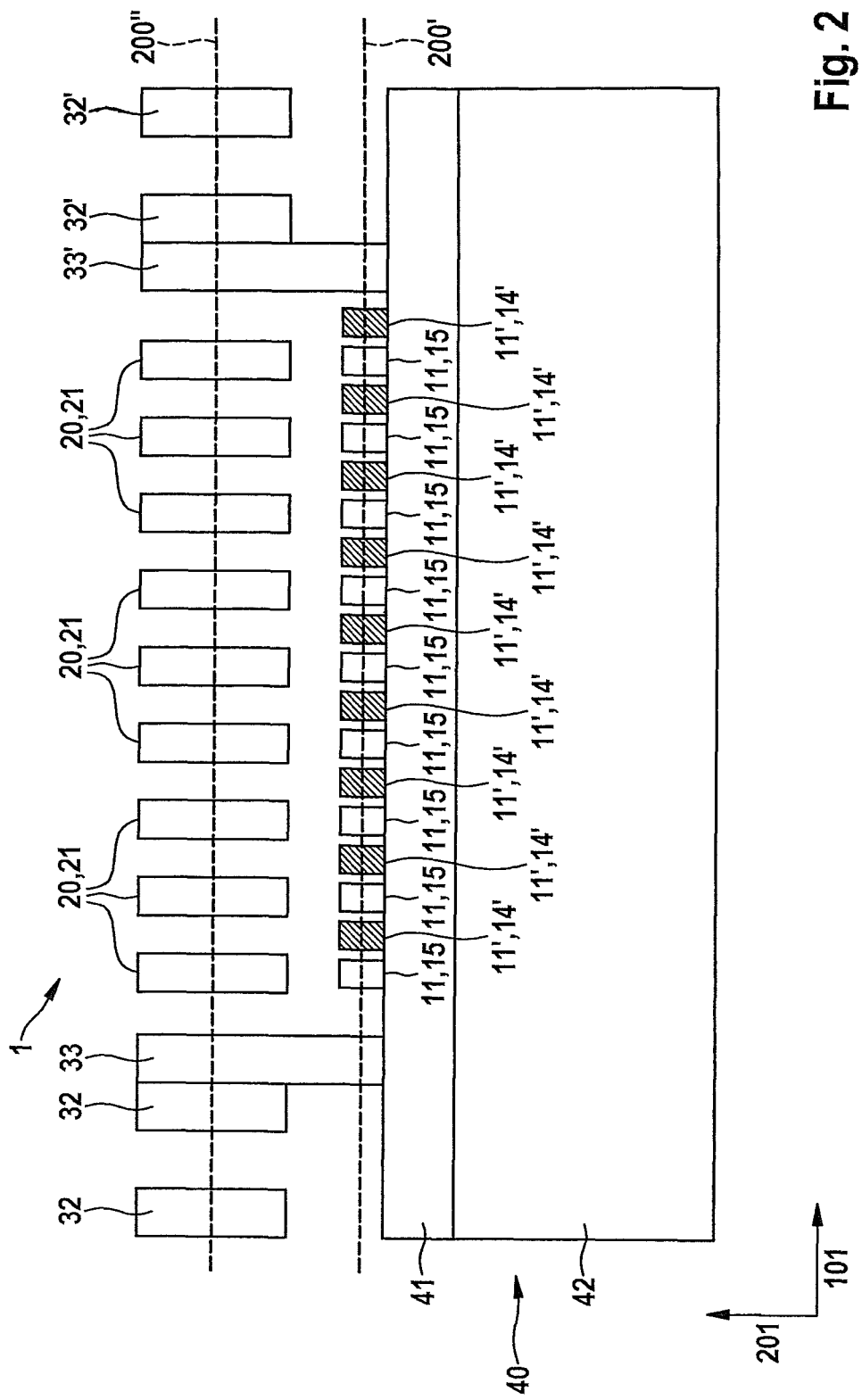
FIG. 2 is a schematic side view in accordance with the first embodiment of the present invention.

Second electrode plane 200" (e.g., shown in FIG. 2) is disposed above first electrode plane 200' in projection direction 201 (e.g., shown in FIG. 2). The micromechanical structure has, at two ends of the movable mass, a respective drive assemblage 30, 30', which is embodied e.g. as a comb drive or piezoelectric drive and with which second electrode 20 is deflected at an oscillation frequency, in particular the resonant frequency of drive assemblage 30, 30', to yield a relative motion. Micromechanical structure 1 encompasses a drive assemblage 30 having a drive arrangement 31 and an elastic spring 32 disposed on an armature 33 fixedly connected to substrate 40, as well as a further drive assemblage 30' having a further drive arrangement 31' and a further spring 32' on an armature 33' fixedly connected to substrate 40. Suspended in second electrode plane 200" between spring 32 and further spring 32' is a movable second electrode 20 that is also referred to as movable mass 20, movable mass 20 or second electrode 20 encompassing the plurality of second sub-electrodes 21 conductively connected to one another. First sub-electrodes 11, further first sub-electrodes 11', and second sub-electrodes 21 have a principal extension direction 102, are all disposed parallel to one another, and are also referred to respectively as first bars 11, further first bars 11, and second bars 21. The second electrode has a ground potential 22, in particular by way of a conductive connection to an external ground (not depicted) having a ground potential 22, for example a conductive part of a housing.

Both the width of second bars 21 of second electrode 20 and the spacings between second bars 21, and the width of first bars 11 of first electrode 11 and the spacings between first bars 11, are dimensioned in such a way that upon a deflection of second electrode 20 into an overlapping position, second bars 21 of second electrode 20 and first bars 11 of first electrode 10 are disposed above one another in projection direction 201. In addition, both the width of second bars 21 of second electrode 20 and the spacings between second bars 21, and the width of further first bars 11' of further first electrode 10' and the spacings between further first bars 11', are dimensioned in such a way that upon a deflection of second electrode 20 into a further overlapping position, second bars 21 of second electrode 20 and further first bars 11' of further first electrode 10' are disposed above one another in projection direction 201. In the overlapping position, further first bars 11' are disposed next to second bars 21 in projection direction 201, and in the further overlapping position, first bars 11 are disposed next to second bars 21 in projection direction 201.

The drive assemblage produces a relative motion of second electrode 20 between the overlapping position and the further overlapping position, the relative motion being a translating motion in a drive direction 101 parallel to principal extension plane 100 of substrate 40 and perpendicular to the principal extension direction of first bars 11, further first bars 11', and second bars 21.

The external electric field that is to be detected, for example the electrostatic field brought about by a thunderstorm or by charges on objects, influences electric charges in further first electrode 10' during the overlapping position, first electrode 10 being shielded by second electrode 21, and in first electrode 10 during the further overlapping position, further first electrode 10' being shielded by second electrode 21. The shielding of the electric field by second electrode 20 is produced by second bars 21, held at ground potential, of first bars 11 or further first bars 11' that are respectively disposed below second bars 21 in projection direction 201.

FIG. 1a is a schematic plan view depicting the first embodiment of micromechanical structure 1 in the overlapping position, second bars 21 of second electrode 20 and first bars 11 of first electrode 10 being disposed above one another in projection direction 201. In this configuration, second bars 21, having ground potential 22, of second electrode 20 block off the external electrostatic field with respect to first bars 11 of the first electrode. In the plan view depicted, first bars 11 of first electrode 10 are disposed below second electrode 20 oppositely to projection direction 201, overlap region 15 being depicted by dotted outlines of first bars 11. Further first bars 11' of further first electrode 10', which in this depiction are not covered and are exposed between the spaced-apart second bars 21 of second electrode 20, are depicted with solid outlines, in particular in a black color, and are not shielded with respect to the external electric field, the exposed region being labeled in this depiction as a further influence region 14'. The result is that in the overlapping positions, electric charges on further first electrode 10' are influenced, a further first voltage signal being generated that is further processed using an evaluation device 50 conductively connected to further first contact point 12' of the further first electrode. By way of drive assemblage 30 and further drive assemblage 30' second electrode 20 is moved, in particular periodically, with respect to first electrode 10 and to further first electrode 10', in a drive direction 101 parallel to principal extension plane 100 and perpendicular to principal extension direction 102 of first bars 11, of further first bars 11', and of second bars 21, between the overlapping position and the further overlapping position.

FIG. 1b is a schematic plan view depicting the first embodiment of micromechanical structure 1 in a position between the overlapping position and the further overlapping position; in this position both first bars 11 of first electrode 10 and further first bars 11' of further first electrode 10' are covered at least in part, in a plan view onto principal extension plane 100 parallel to projection direction 201, by second bars 21 of second electrode 20. First bars 11 of first electrode 10 have an exposed influence region 14, depicted with solid outlines, that is not shielded with respect to the external electric field, and an overlap region 15 depicted with dotted outlines. Further influence region 14' and a further overlap region 15' of further first bars 11' of further first electrode 10' are correspondingly depicted in FIG. 1b.

In the position between the overlapping position and the further overlapping position, both first electrode 10 and further first electrode 10' are only partly shielded with respect to the external electric field by second electrode 20 that is at ground potential, so that charges in influence region 14 of first electrode 10 and in influence region 14' of further first electrode 10' are influenced. A first voltage signal is picked off at first contact point 12, and a further first voltage signal is picked off at further first contact point 12', and are further processed by evaluation device 50.

In the position between the overlapping position and further overlapping position, because of the smaller number of influenced charges thanks to the partial shielding by second electrode 20, the further first voltage signal has a voltage of lower absolute value than in the overlapping position according to FIG. 1a.

FIG. 1c is a schematic plan view depicting the first embodiment of micromechanical structure 1 in the further overlapping position, second bars 21 of second electrode 20 being disposed to shield all further first bars 11' of further first electrode 10' with respect to the external electric field, and all first bars 11 of first electrode 10 having influence region 14 and not being shielded with respect to the external electric field.

FIG. 2 is a schematic side view depicting the first embodiment of micromechanical structure 1 in the overlapping position according to FIG. 1a, in which context second bars 21 of second electrode 20 shield first bars 11 of the first electrode. In the overlapping position, second bars 21 that are disposed in a second electrode plane 200" are oriented in projection direction 201 above first bars 11 that are disposed in a first electrode plane 100". Substrate 40 has an insulating layer 41, in particular an oxide layer, and a silicon layer 42. Armature 33 of the drive assemblage and further armature 33' of the further drive assemblage are fixedly connected to substrate 40, so that an (in particular, periodic) motion of second bars 21 of second electrode 20 in drive direction 101 is produced by way of spring 32 and further spring 32'.

According to a further first embodiment that is not depicted, micromechanical structure 1 has a plurality of first sub-electrodes embodied as circle segments, the plurality of further first sub-electrodes embodied as circle segments, and the plurality of second sub-electrodes embodied as circle segments, the sub-electrodes of each electrode being conductively connected to one another and all circle segments being congruent. Second sub-electrodes embodied as circle segments are also referred to as "vanes." The second electrode of second electrode plane 200" encompasses a vane wheel having the plurality of vanes, which are conductively connected to one another and are at ground potential. The vane wheel is anchored on substrate 40 rotatably around a center point, and is driven by a drive assemblage 30, 30' at a defined oscillation frequency to effect an, in particular periodic, rotational motion.

According to a further second embodiment that is not depicted, micromechanical structure 1 encompasses exactly one first electrode 10 in the first plane, which as a result of deflection of exactly one movable second electrode 10 either is exposed to the external electric field or is shielded with respect to the external electric field.

Figure 3:
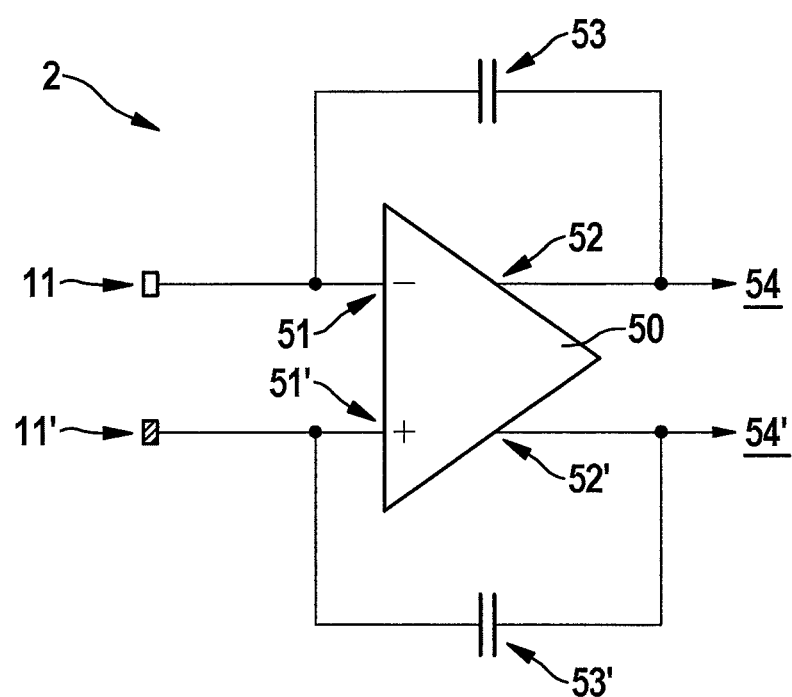
FIG. 3 is a schematic circuit diagram depicting an evaluation device.

FIG. 3 is a schematic circuit diagram depicting an evaluation device 50 of a micromechanical structure 1.

Evaluation device 2, also referred to as evaluation circuit 2, may have an, in particular fully differential, charge amplifier 50 having a first input 51 that is conductively connected to first contact point 12 of first electrode 10, and a second input 51' that is conductively connected to further first contact point 12' of further first electrode 10', as well as a capacitor 52 and a further capacitor 53. The charge amplifier is configured to amplify the first voltage signal brought about by the charges influenced on first electrode 10, and the further first voltage signal brought about by the charges influenced on further first electrode 10'. In a first step, a fully differential output signal is generated by the charge amplifier, by differentiation, from the first voltage signal and the further first voltage signal; second electrode 20 has the reference ground potential necessary for operation of the evaluation circuit. The output signal of charge amplifier 50 is a voltage signal having a frequency equal to the oscillation frequency of the moving second electrode 20. As a signal processing operation proceeds, the output signal is, for example, digitized by an analog/digital converter and further processed, for example calibrated.

The evaluation device generates, from the first voltage signal of first electrode 10 and the further first voltage signal of further first electrode 10' of micromechanical structure 1, an output signal for external electric fields having a field strength in the range from 0.1 to 20 kV/m; the output signal encompasses information regarding the field strength, polarity, and time dependency of the external electric field. Evaluation may be accomplished particularly using a software algorithm that is programmed for mobile application electronics; upon the approach of a thunderstorm outdoors, the software algorithm monitors the polarity change of the electric field of the atmosphere, and/or upon an increase in the field strength of the electric field generates a warning as a function of the detected field strength, the warning encompassing warning stages, for example three warning stages, a lowest warning stage being activated at a measured field strength greater than 1 kV/m, a middle warning stage being activated at a measured field strength greater than 5 kV/m, the highest warning stage being activated at a measured field strength greater than 20 kV/m.

The software algorithm is furthermore configured to generate warnings in the context of electrostatic charges indoors, for example in a residence, and a warning of discharges, for example carpet charging when walking or dressing.

In addition, evaluation circuit 2 may particularly be configured to filter frequencies used in electrical devices, for example in order to distinguish a lightning risk from industrial high-voltage fields.

Figure 4:
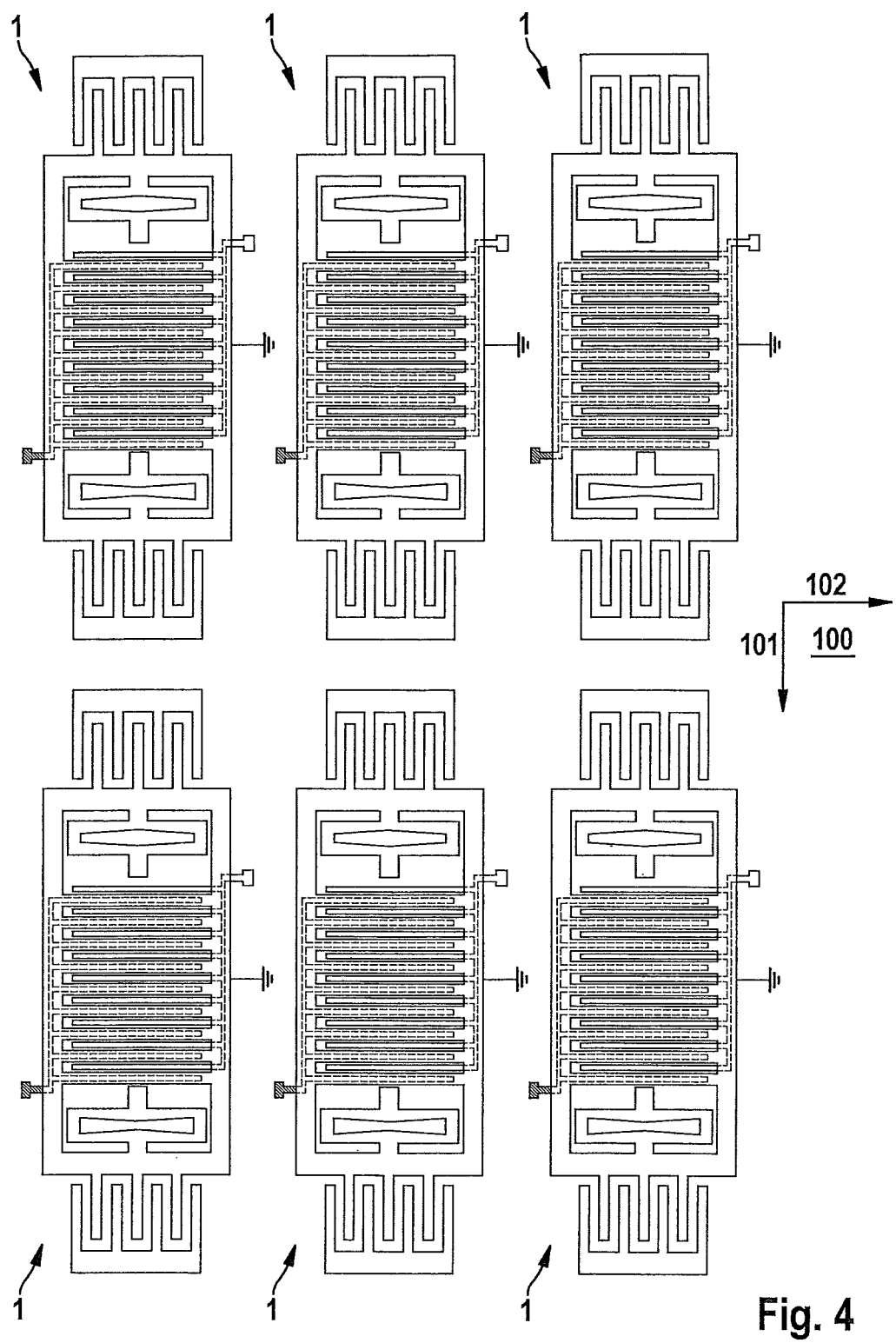
FIG. 4 is a schematic plan view depicting a sensor assemblage in accordance with the present invention.

FIG. 4 is a schematic plan view depicting a sensor assemblage according to the present invention. The sensor assemblage has an assemblage of micromechanical structure 1 in a 3×3 matrix. Principal extension planes 100 of substrates 40 of micromechanical structures 1 disposed in the 3×3 matrix within the sensor assemblage are all located parallel to one another. This makes it possible, particularly advantageously, to perform a positionally resolved measurement of the electric field. For example, the motion of an (in particular, electrostatically charged) object moving past, in particular a user's hand, can be detected. Particularly, the direction of motion of the object moving past may be detected by this assemblage by way also of a time-resolved measurement of the electric field in addition to the positionally resolved one. It is furthermore conceivable to measure in positionally resolved fashion an electric field that is generated by a device and exhibits a defined positional dependence. For example, the electric field exhibiting a defined positional dependence is a two-dimensional barcode generated, in particular by an antenna assemblage of the device, from electric fields. This makes available, particularly advantageously, a capability for using the sensor assemblage in near field communication (also referred to as NFC), for example in order to read out electrostatically charged letters, in particular Braille.

Figure 5:
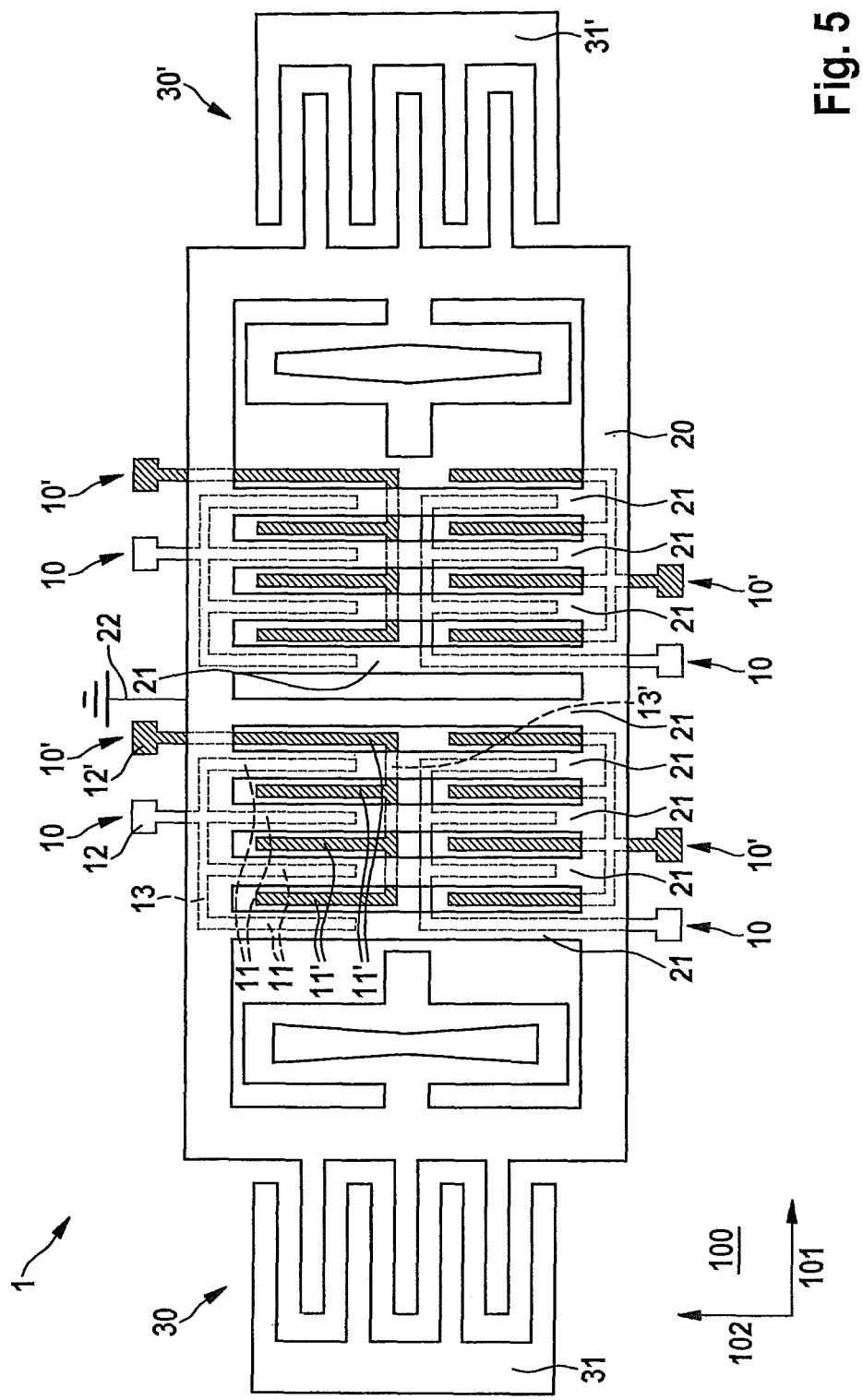
FIG. 5 is a schematic plan view in accordance with a second embodiment of the present invention.

FIG. 5 is a schematic plan view depicting a micromechanical structure 1 according to a second embodiment of the present invention, the micromechanical structure being in particular a micromechanical electric field meter as a thunderstorm warning device. The second embodiment depicted in FIG. 5 corresponds substantially to the first embodiment depicted by way of example in FIG. 1; the second embodiment differs from the first embodiment in that micromechanical structure 1 has four first electrodes 10 and four further first electrodes 10', in particular both the four first electrodes 10 and the four further first electrodes 10' being electrically insulated from one another, and being disposed in particular in first electrode plane 200'.

One respective first electrode 10 of the four electrodes 10 and one further first electrode 10' of the four further electrodes 10' may respectively make up a unit 10, 10', in particular a total of four such units 10, 10' being disposed parallel to the principal extension plane in first electrode plane 200' in such a way that each two units 10, 10' are disposed behind one another in drive direction 101. Furthermore, the four units 10, 10' are disposed in first electrode plane 200' in particular in such a way that each two units 10, 10' are disposed behind one another in both the direction parallel to main extension plane 100 of substrate 40 and in the direction perpendicular to drive direction 101. This disposition is comparable in particular to a checkerboard-like disposition of the four units 10, 10'.

Each individual unit 10, 10' of the four units is, in particular, embodied in accordance with the first embodiment, a relative motion of second electrode 20 in drive direction 101 with respect to first electrode 10 and with respect to further first electrode 10', between an overlapping position and a further overlapping position, being produced by drive assemblage 30 and in particular by further drive assemblage 30'. In the overlapping position, first electrode 10 and second electrode 20 are disposed above one another in the overlapping position in the projection direction 201 extending perpendicular to principal extension plane 100 of substrate 40. In the further overlapping position, further first electrode 10' and second electrode 20 are disposed above one another in projection direction 201. In the overlapping position and in particular in the further overlapping position, second electrode 20 has a defined potential 22 in order shield first electrode 10 with respect to the electric field.

Particularly, micromechanical structure 1 having the four units 10, 10', which can also be referred to respectively as detection units 10, 10', may be configured according to the second embodiment for position-resolved and/or time-resolved measurement of charges influenced by an external electric field. The second embodiment is, in particular, a realization of the sensor assemblage depicted in FIG. 4, having four rather than nine detector units or sensors in a single micromechanical structure 1.

The micromechanical structure according to the present invention can be identified by microscopic examination of the micromechanical structure.

The micromechanical structure according to the present invention can be used to detect all electric fields, in particular of the Earth's atmosphere. The structure according to the present invention is particularly suitable for portable objects or as a sensor for Bosch Sensortec products, and in particular as motor-vehicle applications as a thunderstorm warning device. Provision is also made for apps that make use of the micromechanical structure according to the present invention in a mobile telephone or smartphone.

What is claimed is:

1. A micromechanical device, comprising:
   a substrate having a principal extension plane;
   a first electrode having a plurality of spaced apart first sub-electrodes;
   a further first electrode having a plurality of spaced apart further first sub-electrodes interleaved with the first sub-electrodes;
   a second electrode suspended from the substrate above the first and further first electrodes by at least one spring located between the second electrode and a drive assemblage; and
   the drive assemblage, for producing a relative motion of the second electrode with respect to the first and further first electrodes alternately between an overlapping position, with the first electrode and the second electrode being disposed one above another in a projection direction extending perpendicularly to the principal extension plane of the substrate, and a further overlapping position, with the further first electrode and the second electrode being disposed one above another in the projection direction.

2. The micromechanical device of claim 1, wherein the defined potential is a ground potential of the Earth.

3. The micromechanical device of claim 1, wherein the first electrode and the further first electrode are disposed in a first electrode plane oriented parallel to the principal extension plane of the substrate, the first electrode and the further first electrode being disposed in the first electrode plane in a manner electrically insulated from one another, the second electrode being disposed in a second electrode plane oriented parallel to the principal extension plane of the substrate.

4. The micromechanical device of claim 1, wherein the second electrode has a plurality of second sub-electrodes, the drive assemblage being configured to produce the relative motion of the second electrode between the overlapping position and an uncovered position, the first sub-electrodes and second sub-electrodes being, in the uncovered position, disposed at least in part next to one another in the projection direction.

5. The micromechanical device of claim 1, wherein the first sub-electrodes, the further first sub-electrodes, and second sub-electrodes of the second electrode have a principal extension direction parallel to the principal extension plane of the substrate, the drive assemblage being configured to produce the relative motion of the second electrode in a drive direction perpendicular to the principal extension direction.

6. The micromechanical device of claim 1, wherein the second electrode has a plurality of second sub-electrodes conductively connected to one another, the plurality of first sub-electrodes and the plurality of second sub-electrodes all being, in the overlapping position, disposed one above another in the projection direction, and the plurality of further first sub-electrodes and the plurality of second sub-electrodes all being, in the further overlapping position, disposed one above another in the projection direction.

7. The micromechanical device of claim 1, wherein the plurality of first sub-electrodes, the plurality of further first sub-electrodes, and a plurality of second sub-electrodes of the second electrode are all oriented parallel to the principal extension direction, the plurality of first sub-electrodes all being disposed spaced apart from one another, the plurality of further first sub-electrodes all being disposed spaced apart from one another, and the plurality of second sub-electrodes all being disposed spaced apart from one another.

8. The micromechanical device of claim 1, wherein the substrate of the micromechanical structure includes at least one of: silicon, a conductive polymer, or a ceramic; and further comprising a housing including at least one of: silicon, a polymer, or a ceramic.

9. An electrical device, comprising:
a micromechanical structure, including:
   a substrate having a principal extension plane;
   a first electrode having a plurality of spaced apart first sub-electrodes;
   a further first electrode having a plurality of spaced apart further first sub-electrodes interleaved with the first sub-electrodes;
   a second electrode having a plurality of spaced apart second sub-electrodes and being suspended from the substrate above the first electrode by at least one spring located between the second electrode and a drive assemblage; and
   the drive assemblage, for producing a relative motion of the second electrode with respect to the first electrode into an overlapping position, with the first electrode and the second electrode being disposed one above another in a projection direction extending perpendicularly to the principal extension plane of the substrate, wherein the drive assemblage produces motion of the second electrode with respect to the first and further first electrodes alternately between the overlapping position and a further overlapping position, in which the further first electrode and the second electrode being disposed one above another in the projection direction.

10. A sensor assemblage, comprising:
a plurality of micromechanical structures, each of the micromechanical structures including:
   a substrate having a principal extension plane;
   a first electrode having a plurality of spaced apart first sub-electrodes;
   a further first electrode having a plurality of spaced apart further first sub-electrodes interleaved with the first sub-electrodes;
   a second electrode having a plurality of spaced apart second sub-electrodes and being suspended from the substrate above the first electrode by at least one spring located between the second electrode and a drive assemblage; and
   the drive assemblage, for producing a relative motion of the second electrode with respect to the first electrode into an overlapping position, with the first electrode and the second electrode being disposed one above another in a projection direction extending perpendicularly to the principal extension plane of the substrate, wherein the drive assemblage produces motion of the second electrode with respect to the first and further first electrodes alternately between the overlapping position and a further overlapping position, in which the further first electrode and the second electrode being disposed one above another in the projection direction;
wherein, for positionally resolved measurement of the electric field, the principal extension planes of the substrates of the plurality of micromechanical structures are disposed at least one of: parallel to one another, or perpendicular to one another.

11. The sensor assemblage of claim 10, wherein the sensor assemblage is configured with the principal extension planes of the substrates of the plurality of micromechanical structures disposed parallel to one another for at least one of: non-contact detection of a motion of an electrostatically charged object, or detection of an electric field generated by a device other than the sensor assemblage.

12. The micromechanical device of claim 1, wherein the drive assemblage provides the relative motion at a predetermined oscillation frequency.

13. The micromechanical device of claim 1, wherein the first and further first electrodes provide a differential signal representing a field strength of an electric field about the micromechanical structure.

14. The micromechanical device of claim 1, wherein the first and further first electrodes provide a differential signal representing a polarity of an electric field about the micromechanical structure.

15. The micromechanical device of claim 1, further comprising an amplifier to receive signals from the first and further first electrodes and provide a signal representing at least one of: a field strength of an electric field about the micromechanical structure, or a polarity of the electric field about the micromechanical structure.

16. The micromechanical device of claim 15, further comprising an analog to digital converter to generate a digital signal representing the at least one of: the field strength of the electric field about the micromechanical structure, or the polarity of the electric field about the micromechanical structure.

17. The micromechanical device of claim 1, wherein the at least one spring includes a first spring located between the second electrode and a first portion of the drive assemblage and a second spring located between the second electrode and a second portion drive assemblage.

* * * * *